US006985821B2

(12) United States Patent
Kawabata

(10) Patent No.: US 6,985,821 B2
(45) Date of Patent: Jan. 10, 2006

(54) APPARATUS FOR CALCULATING AN EFFECTIVE VOLTAGE

(75) Inventor: Kentaro Kawabata, Saitama (JP)

(73) Assignee: Denyo Co., Ltd., Tokyo (JP)

(*) Notice: Subject to any disclaimer, the term of this patent is extended or adjusted under 35 U.S.C. 154(b) by 2 days.

(21) Appl. No.: 10/832,236

(22) Filed: Apr. 27, 2004

(65) Prior Publication Data

US 2005/0149281 A1 Jul. 7, 2005

(30) Foreign Application Priority Data

Jan. 5, 2004 (JP) ............................. 2004-000001

(51) Int. Cl.
G06F 19/00 (2006.01)
G01R 31/00 (2006.01)
H02P 9/00 (2006.01)

(52) U.S. Cl. ........................... 702/64; 322/28; 324/525

(58) Field of Classification Search ................. 702/60, 702/64, 67, 57; 322/28; 323/243, 284; 324/142, 324/525; 363/26, 59, 159; 361/93.4; 219/110; 341/118, 120

See application file for complete search history.

(56) References Cited

U.S. PATENT DOCUMENTS

2003/0112015 A1* 6/2003 Takakamo et al. .......... 324/525
2005/0104561 A1* 5/2005 Kawabata .................... 322/28

FOREIGN PATENT DOCUMENTS

JP 10-010163 1/1998

* cited by examiner

Primary Examiner—Michael Nghiem
Assistant Examiner—John Le
(74) Attorney, Agent, or Firm—Squire, Sanders & Dempsey LLP

(57) ABSTRACT

An apparatus for calculating an effective voltage is provided, which includes a voltage reducer, an analogue to digital converter, a first detector, a second detector and a calculator. The voltage reducer steps down instantaneous output voltages of a generator. The analogue to digital converter converts each analogue signal of the instantaneous output voltages into a digital signal. The first detector detects a first signal of digitized instantaneous output voltage. The second detector detects a second signal, which differs in terms of phase by 120 deg. from the first signal. The calculator calculates an effective voltage according to the first and second signals, by executing a calculation with an expression: $E=\{2(V_a^2+V_aV_b+V_b^2)/3\}^{1/2}$, where E represents the effective voltage, $V_a$ the first signal of instantaneous output voltage and $V_b$ the second signal, respectively.

4 Claims, 1 Drawing Sheet

APPARATUS FOR CALCULATING AN EFFECTIVE VOLTAGE

BACKGROUND OF THE INVENTION

The present invention pertains to an apparatus for calculating an effective output voltage of a generator.

In a method for calculating the output voltage of a three-phase generator, detection has been conducted for all the three phases which are rectified after stepping down of output voltages by a transformer. However, the method, which detects an average of output voltages, tends to provide an erroneous result when a voltage waveform varies according to load conditions, namely a load existing case and a load non-existing case, due to distortion. For this reason, it has been difficult to achieve good voltage regulation when the average is introduced as an input for controlling an automatic voltage regulator.

In order to overcome the drawback described above, another method has been introduced, which calculates an effective value by an expression (a), incorporating the number M of instantaneous output voltages that are sampled over a period for a sampling frequency correlated with the selected frequency of an output voltage $V_i$.

$$\text{effective value} = \left((1/M)\sum_i V_i^2\right)^{1/2} \quad \text{(a)}$$

Japanese Published Patent Application H10-10163 discloses the related arts.

Although this method is advantageous in calculating a true effective output voltage, the method poses another problem that it can not be appropriately applied to an automatic voltage regulator because it takes too much time, one period, to calculate an effective value for controlling the regulator. The method poses the other problem that it leads to complicated processing conducted by a microcomputer because the time interval for accumulation of data samples varies according to the frequencies of the detected output voltage.

SUMMARY OF THE INVENTION

The present invention seeks to provide an apparatus for calculating an effective voltage, which is able to execute a calculation to obtain the effective voltage with high accuracy in a short period of time.

According to an aspect of the present invention, an apparatus for calculating an effective voltage is provided, which includes a voltage reducer, an analogue to digital converter, a first detector, a second detector and a calculator. Description is given to each of these components. The voltage reducer steps down instantaneous output voltages of a generator at a predetermined rate. The analogue to digital converter converts each analogue signal of the instantaneous output voltages, which are stepped down by the voltage reducer, into a digital signal. The first detector detects a first signal of instantaneous output voltage which is digitized by the analogue to digital converter. The second detector detects a second signal of instantaneous output voltage which is digitized by the analogue to digital converter and differs in terms of phase by 120 deg. from the first signal. The calculator calculates an effective voltage of the generator according to the first and second signals which are detected by the first and second detectors respectively, by executing a calculation with an expression (b):

$$E = \{2(V_a^2 + V_a V_b + V_b^2)/3\}^{1/2} \quad \text{(b)}$$

where E represents the effective voltage, $V_a$ the first signal of instantaneous output voltage and $V_b$ the second signal of instantaneous output voltage, respectively.

According to another aspect of the present invention, an apparatus for calculating an effective voltage is provided, which further includes a memory unit for storing a group of time-sequential data of effective voltages including the latest value and a predetermined number of prior values each time the calculator calculates one effective voltage, and a moving average calculator for reading this effective voltage and calculating a moving average from the group of time-sequential data after replacing the oldest value thereof stored in the memory unit with this effective voltage.

According to still another aspect of the present invention, an apparatus for calculating an effective voltage is provided, which includes a voltage reducer, an analogue to digital converter, a first detector, a second detector, a third detector and an average calculator. Description is given to each of these components. The voltage reducer steps down instantaneous output voltages of a generator at a predetermined rate. The analogue to digital converter converts each analogue signal of the instantaneous output voltages, which are stepped down by the voltage reducer, into a digital signal. The first detector detects a first signal of instantaneous output voltage which is digitized by the analogue to digital converter. The second detector detects a second signal of instantaneous output voltage which is digitized by the analogue to digital converter and differs in terms of phase by 120 deg. from the first signal. The third detector detects a third signal of instantaneous output voltage which is digitized by the analogue to digital converter and differs in terms of phase by 120 deg. from the second signal. The average calculator calculates an average effective voltage of the generator according to a first effective voltage calculated with the first and second signals, a second effective voltage calculated with the second and third signals and a third effective voltage calculated with the third and first signals, by executing a calculation with an expression (c):

$$E_m = (E_1 + E_2 + E_3)/3 \quad \text{(c)}$$

where $E_m$ represents the average effective voltage, $E_1$ the first effective voltage, $E_2$ the second effective voltage and $E_3$ the third effective voltage, respectively.

According to yet another aspect of the present invention, an apparatus for calculating an effective voltage is provided, which further includes a memory unit for storing a group of time-sequential data of average effective voltage including the latest value and a predetermined number of prior values each time the average calculator calculates one average effective voltage, and a moving average calculator for reading this average effective voltage and calculating a moving average from the group of time-sequential data after replacing the oldest value thereof stored in the memory unit with this average effective voltage.

The apparatus described above is able to instantaneously calculate the effective voltage with high accuracy, compared to a conventional method which calculates it by rectifying all the waves each time instantaneous output voltages are detected. In this way, introducing the effective voltage obtained by the apparatus according to the present invention in controlling of various types of electrical unit, it may be possible to decrease an error in voltage regulation.

It may also be possible to average a measurement error existing in effective voltage by calculating an average effective voltage among the first to third effective voltages with the average calculator.

Furthermore, it may be possible to increase the accuracy of calculation by correcting the effective voltage or average effective voltage with the moving average which is calculated for the predetermined number of effective voltages or average effective voltages. In this way, the accuracy can be improved even if the output voltage of a generator does not have an ideal waveform, having distortion due to noise and higher harmonics.

DESCRIPTION OF THE PREFERRED EMBODIMENTS

Figure 1:
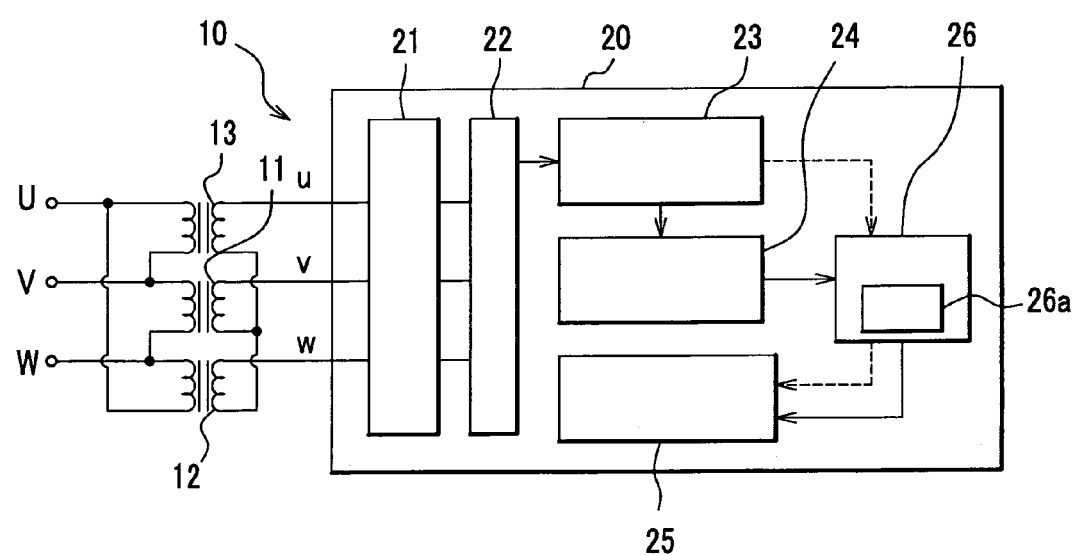
FIG. 1 is a block diagram showing an apparatus for calculating an effective voltage according to the present invention.

An embodiment of the present invention is now described with reference to FIG. 1. In the following description, a three-phase generator (not shown) which has armature windings U, V and W is selected as an example.

a. Method for Calculating an Effective Voltage

The waveform of output voltage of a three-phase generator is represented by a set of three sinusoidal curves, numerical expressions (1-1) to (1-3), which have a phase difference of 120 deg. relative to each other.

$$V_{uv,t} = \sqrt{2} \times \bar{E}_t \times \sin(\omega t + \theta) \quad (1\text{-}1)$$

$$V_{vw,t} = \sqrt{2} \times \bar{E}_t \times \sin(\omega t + \theta - 2\pi/3) \quad (1\text{-}2)$$

$$V_{wu,t} = \sqrt{2} \times \bar{E}_t \times \sin(\omega t + \theta - 4\pi/3) \quad (1\text{-}3)$$

$V_{uv,t}$: an instantaneous output voltage detected between armature windings U and V (corresponding to a third detected voltage to be described later)

$V_{vw,t}$: an instantaneous output voltage detected between armature windings V and W (corresponding to a first detected voltage to be described later)

$V_{wu,t}$: an instantaneous output voltage detected between armature windings W and U (corresponding to a second detected voltage to be described later)

According to the present invention, it is possible to calculate a first effective voltage from two of the three instantaneous output voltages described above, for example $V_{vw,t}$ which is representative of a first instantaneous output voltage and $V_{wu,t}$ a second instantaneous output voltage.

Applying the addition theorem to the expressions (1-2) and (1-3), they result in expressions (2-2) and (2-3), respectively.

$$V_{vw,t} = \sqrt{2} \times \bar{E}_t \{ -(½)\sin(\omega t+\theta) - (\sqrt{3}/2)\cos(\omega t+\theta) \} \quad (2\text{-}2)$$

$$V_{wu,t} = \sqrt{2} \times \bar{E}_t \{ -(½)\sin(\omega t+\theta) + (\sqrt{3}/2)\cos(\omega t+\theta) \} \quad (2\text{-}3)$$

Because addition of the expressions (2-2) and (2-3) makes $V_{vw,t} + V_{wu,t} = -\sqrt{2} \times \bar{E}_t \times \sin(\omega t+\theta)$, $\sin(\omega t+\theta)$ is represented by an expression (3-1).

$$\sin(\omega t+\theta) = -(V_{vw,t} + V_{wu,t})/(\sqrt{2}\bar{E}_t) \quad (3\text{-}1)$$

Because subtracting the expression (2-3) from (2-2) results in $V_{vw,t} - V_{wu,t} = -\sqrt{6} \times \bar{E}_t \times \cos(\omega t+\theta)$, $\cos(\omega t+\theta)$ is represented by an expression (3-2).

$$\cos(\omega t+\theta) = -(V_{vw,t} - V_{wu,t})/(\sqrt{6}\bar{E}_t) \quad (3\text{-}2)$$

Taking into account $\sin^2(\omega t+\theta) + \cos^2(\omega t+\theta) = 1$, an expression (4-1) can be obtained from the expressions (3-1) and (3-2).

$$(\bar{E}_t)_1 = \{2(V^2_{vw,t} + V_{vw,t}V_{wu,t} + V^2_{wu,t})/3\}^{1/2} \quad (4\text{-}1)$$

It is noted that a first effective voltage $\bar{E}_t$ is represented in a form of $(\bar{E}_t)_1$.

Similarly, a second effective voltage $(\bar{E}_t)_2$ shown by an expression (4-2) is obtained from $V_{wu,t}$ and $V_{uv,t}$, which are shown by the expressions (1-3) and (1-1), respectively. A third effective voltage $(\bar{E}_t)_3$ shown by an expression (4-3) is also obtained from $V_{uv,t}$ and $V_{vw,t}$, which are shown by the expressions (1-1) and (1-2), respectively.

$$(\bar{E}_t)_2 = \{2(V^2_{wu,t} + V_{wu,t}V_{uv,t} + V^2_{uv,t})/3\}^{1/2} \quad (4\text{-}2)$$

$$(\bar{E}_t)_3 = \{2(V^2_{uv,t} + V_{uv,t}V_{vw,t} + V^2_{vw,t})/3\}^{1/2} \quad (4\text{-}3)$$

Taking an average of the first to third effective voltages shown by the expressions (4-1) to (4-3) in accordance with the expression (5-1), it may be possible to smooth out the measurement error.

$$(\bar{E}_t)_m = \{(\bar{E}_t)_1 + (\bar{E}_t)_2 + (\bar{E}_t)_3\}/3 \quad (5\text{-}1)$$

$(\bar{E}_t)_m$: average effective voltage at the time of t

The method described above can be effectively applied in particular to the output voltage of a three-phase generator, whose waveform has an ideal sinusoidal curve.

On the other hand, when the waveform of a three-phase generator departs from an ideal sinusoidal curve due to noise and higher harmonics, it may be possible to introduce a moving average. The moving average is represented by an expression (6-1) and is obtained by taking a moving average for a group of time-sequential data of average effective voltages or effective voltages including the value at the time of t and a predetermined number N of prior values, for example N equals four.

$$E'_t = \sum_{t'=1}^{N} (\bar{E}_{t'})_m / N \quad (6\text{-}1)$$

$E'_t$: a moving average for average effective voltage at the time of t $t'$: time going back from the time of t for the predetermined number N of prior values $\sum_{t'=1}^{N}$: summation of $(\bar{E}_{t'})_m$ with $t'$ 1 to N b. Apparatus for Calculating an Effective Voltage An apparatus 10 for calculating an effective voltage, which is electrically connected to a three-phase generator (not shown), includes a first to third transformers 11 to 13 and a microcomputer 20. The microcomputer 20 includes an analogue to digital converter (hereinafter referred to as "A/D converter") 21, an output voltage detector 22, an effective voltage calculator 23, an average effective voltage calculator 24, a moving average effective voltage calculator 25 and a memory unit 26.

As shown in FIG. 1, each of the first to third transformers 11 to 13 is for stepping down instantaneous output voltages of a generator at a predetermined rate. A primary winding of the first transformer 11 is electrically connected to output terminals for generator armature windings V and W. Similarly, a primary winding of the second transformer 12 is electrically connected to output terminals for generator armature windings W and U, and a primary winding of the third transformer 13 to output terminals for generator armature windings U and V. On the other hand, secondary windings of the first to third transformers 11 to 13 are electrically connected to the A/D converter 21.

The A/D converter 21 converts instantaneous analogue output voltages, which are stepped down by the first to third transformers 11 to 13, into digital values, delivering them to the output voltage detector 22. Hereinafter, the instantaneous output voltages, which are delivered by the A/D converter 21 after their stepping down by the first, second and third transformers 11, 12 and 13 and detected by the output detector 22, are referred to as "first detected voltage", "second detected voltage" and "third detected voltage", respectively.

In the present embodiment, one A/D converter 21 converts instantaneous analogue signals of the three-phase generator, which are stepped down by the first to third transformers 11 to 13, into digital signals. Also, one output voltage detector 22 detects these digital signals at a predetermined period, for example 400 micro seconds. The effective voltage calculator 23, the average effective voltage calculator 24 and the moving average effective voltage calculator 25 execute a series of calculations for the signals.

In this connection, it may be possible to adopt the same number of A/D converters and output voltage detectors respectively as that of instantaneous voltages of a three-phase generator, so that one-to-one correspondence between these components and the voltages is established.

The effective voltage calculator 23 calculates the first to third effective voltages according to the first to third detected voltages obtained by the output voltage detector 22. Executing calculation with the expressions (4-1) to (4-3), the calculator 23 calculates these first to third effective voltages according to the first to third detected voltages at the time of t.

Executing calculation with the expression (5-1), the average effective voltage calculator 24 calculates an average effective voltage according to the first to third effective voltages calculated by the effective voltage calculator 23. The resultant average effective voltage is adapted to be stored in a memory 26a of the memory unit 26.

The memory unit 26 has the memory 26a, which stores a group of time-sequential data of the average effective voltages in a predetermined number. The memory 26a is adapted to memorize the group of time-sequential data including the latest value and the predetermined number of prior values. Each time the average effective voltage calculator 24 generates an average effective voltage at a predetermined period, the memory unit 26 reads and stores it into the memory 26a. The memory unit 26, which replaces the oldest average effective voltage stored in the memory 26a with the latest one, is able to store the group of time-sequential data including the latest average effective voltage and the predetermined number of prior ones into the memory 26a.

Each time the average effective voltage calculator 24 generates an average effective voltage, the moving average effective voltage calculator 25 calculates a moving average effective voltage with the expression (6-1) according to the group of time-sequential data of the average effective voltages, which are taken out of the memory 26a.

The resultant moving average effective voltage and the first to third effective voltages are delivered to other modules in the microcomputer 20 so that they can be incorporated as inputs into an automatic voltage regulator or an inverter which is electrically connected to a three-phase generator.

c. Operation of an Apparatus for Calculating an Effective Voltage

Operation of the apparatus 10 for calculating an effective voltage according to the present invention is now described.

Instantaneous voltages of a three-phase generator, which have a phase difference of 120 deg. relative to each other, are stepped down at a predetermined rate of voltage by the first to third transformers 11 to 13 and converted into digital values by the A/D converter 21, then being detected by the output voltage detector 22.

The detected first to third voltages are incorporated into the effective voltage calculator 23, which calculates the first to third effective voltages by executing calculation with the expressions (4-1) to (4-3). Receiving these first to third effective voltages, the average effective voltage calculator 24 calculates an average effective voltage with the expression (5-1), which is to be stored in the memory 26a.

Each time the average effective voltage calculator 24 generates the average effective voltage, the moving average effective voltage calculator 25 reads it. The calculator 24 then replaces the oldest value in the group of time-sequential data taken out of the memory 26a with this latest average effective voltage, and calculates a moving average effective voltage according to the updated group of time-sequential data by executing calculation with the expression (6-1), delivering it to other modules in the microcomputer 20.

In the embodiment described above, the moving average effective voltage calculator 25 calculates a moving average effective voltage according to average effective voltages generated by the average effective voltage calculator 24. As shown by a dotted line in FIG. 1, it may alternatively be possible for the calculator 25 to calculate a moving average effective voltage according to first to third effective voltages generated by the effective voltage calculator 23 instead of the average effective voltage.

Introducing the effective voltage calculator 23, the apparatus 10 according to the present invention can achieve a more accurate effective voltage compared with an average obtained by rectifying whole waves, each time the apparatus 10 detects the first to third instantaneous voltages of a three-phase generator. If this effective voltage is applied to various types of control, it may be possible to decrease an error in voltage regulation.

Although the effective voltage described above is less impeccable compared with a true effective value, it can be beneficially used as an input for an automatic voltage regulator or an inverter which is electrically connected to a three-phase generator, because the effective voltage, which is not generated according to data sampled over one period but that obtained in the predetermined period, can be quickly calculated.

Also, subsequent processing of the calculated effective voltage can be easily conducted by the microcomputer 20 and the like because it is independent of the frequency of output voltage of the three-phase generator.

Furthermore, even if wave distortion occurs due to the output voltage of a three-phase generator affected by noise and higher harmonics, it may be possible to increase the accuracy of effective voltage because the apparatus 10 according to the present invention is able to correct an average effect voltage with a moving average calculated by the moving average effective voltage calculator 25, which is defined for a predetermined number of average effective voltages.

It will now be appreciated from the foregoing description that the present invention is not limited to the particularly illustrated embodiment discussed above and may be carried out in various modified forms.

Although the embodiment described above uses three transformers, it may be possible to adopt one three-phase transformer instead, which is able to step down voltage at a predetermined rate. Therefore, it may be possible to arbitrarily select the number of transformers as long as it functionally meets the number of phases.

Instead of the embodiment described above which uses a three-phase generator, it may be possible to adopt other generators which are able to generate output voltages having a 120 deg. phase difference.

Although in the embodiment described above, the output voltage detector is selected, which detects the instantaneous line voltages, it may be possible to alternatively select another detector which detects instantaneous phase voltages.

Furthermore, it may be possible to apply the apparatus for calculating an effective voltage to various types of generator such as a generator driven by an engine.

What is claimed is:

1. An apparatus for calculating an effective voltage comprising:
   a voltage reducer for stepping down instantaneous output voltages of a generator at a predetermined rate;
   an analogue to digital converter for converting each analogue signal of the instantaneous output voltages, which are stepped down by the voltage reducer, into a digital signal;
   a first detector for detecting a first signal of instantaneous output voltage which is digitized by the analogue to digital converter;
   a second detector for detecting a second signal of instantaneous output voltage which is digitized by the analogue to digital converter and differs in terms of phase by 120 deg. from the first signal; and
   a calculator for calculating an effective voltage of the generator according to the first and second signals which are detected by the first and second detectors respectively, by executing a calculation with an expression (1):

$$E = \{2(V_a^2 + V_a V_b + V_b^2)/3\}^{1/2} \qquad (1)$$

where E represents the effective voltage, $V_a$ the first signal of instantaneous output voltage and $V_b$ the second signal of instantaneous output voltage, respectively.

2. An apparatus of claim 1, further comprising:
   a memory unit for storing a group of time-sequential data of effective voltages including the latest value and a predetermined number of prior values each time the calculator calculates one effective voltage; and
   a moving average calculator for reading the effective voltage and calculating a moving average from the group of time-sequential data after replacing the oldest value thereof stored in the memory unit with the effective voltage.

3. An apparatus for calculating an effective voltage comprising:
   a voltage reducer for stepping down instantaneous output voltages of a generator at a predetermined rate;
   an analogue to digital converter for converting each analogue signal of the instantaneous output voltages, which are stepped down by the voltage reducer, into a digital signal;
   a first detector for detecting a first signal of instantaneous output voltage which is digitized by the analogue to digital converter;
   a second detector for detecting a second signal of instantaneous output voltage which is digitized by the analogue to digital converter and differs in terms of phase by 120 deg. from the first signal;
   a third detector for detecting a third signal of instantaneous output voltage which is digitized by the analogue to digital converter and differs in terms of phase by 120 deg. from the second signal; and
   an average calculator for calculating an average effective voltage of the generator according to a first effective voltage calculated with the first and second signals, a second effective voltage calculated with the second and third signals and a third effective voltage calculated with the third and first signals, by executing a calculation with an expression (2):

$$E_m = (E_1 + E_2 + E_3)/3 \qquad (2)$$

where $E_m$ represents the average effective voltage, $E_1$ the first effective voltage, $E_2$ the second effective voltage and $E_3$ the third effective voltage, respectively.

4. An apparatus of claim 3, further comprising:
   a memory unit for storing a group of time-sequential data of average effective voltages including the latest value and a predetermined number of prior values each time the average calculator calculates one average effective voltage; and
   a moving average calculator for reading the average effective voltage and calculating a moving average from the group of time-sequential data after replacing the oldest value thereof stored in the memory unit with the average effective voltage.

* * * * *